(12) United States Patent
Ates

(10) Patent No.: US 10,996,697 B2
(45) Date of Patent: May 4, 2021

(54) SWITCHED CAPACITOR BIASING CIRCUIT

(71) Applicant: Qorvo International Pte. Ltd., Singapore (SG)

(72) Inventor: Erdogan Ozgur Ates, Maarssen (NL)

(73) Assignee: Qorvo International Pte. Ltd., Singapore (SG)

( * ) Notice: Subject to any disclaimer, the term of this patent is extended or adjusted under 35 U.S.C. 154(b) by 62 days.

(21) Appl. No.: 16/405,309

(22) Filed: May 7, 2019

(65) Prior Publication Data

US 2019/0258281 A1 Aug. 22, 2019

Related U.S. Application Data

(62) Division of application No. 15/518,071, filed as application No. PCT/NL2014/050709 on Oct. 13, 2014, now Pat. No. 10,359,794.

(51) Int. Cl.
*G05F 3/02* (2006.01)
*G05F 1/56* (2006.01)
(Continued)

(52) U.S. Cl.
CPC ............ *G05F 1/56* (2013.01); *G05F 3/24* (2013.01); *H03K 3/0315* (2013.01)

(58) Field of Classification Search
CPC ... G05F 1/56; G05F 1/575; G05F 3/24; G05F 3/242; G05F 3/245; G05F 3/247; G05F 3/262; H03K 3/0315
See application file for complete search history.

(56) References Cited

U.S. PATENT DOCUMENTS 4,703,249 A 10/1987 De La Plaza et al.
5,124,593 A 6/1992 Michel
(Continued)

FOREIGN PATENT DOCUMENTS

EP 0766385 A2 4/1997
FR 2586309 A1 2/1987
(Continued)

OTHER PUBLICATIONS

Gregoire, B. Robert et al., "A Sub 1-V Constant Gm—C Switched-Capacitor Current Source," IEEE Transactions on Circuits and Systems-II Express Briefs, vol. 54, Issue 3, Mar. 2007, IEEE, pp. 222-226.
(Continued)

*Primary Examiner* — Long Nguyen
(74) *Attorney, Agent, or Firm* — Withrow & Terranova, P.L.L.C.

(57) ABSTRACT

Bias circuit and a bias generator circuit comprising such a bias circuit. The bias circuit (10, 11) comprises a switched capacitor resistor circuitry (C1, C2, M12-M17), and an operational amplifier (M1-M4, M10) with an input differential transistor pair (M1, M2). The bias circuit further comprises additional source follower transistors (M5, M6) associated with the first and second input differential transistors (M1, M2). The bias generator circuit has a PMOS switched capacitor reference circuit (11) and a NMOS switched capacitor reference circuit (10) and a transconductor reference cell (15). The transconductor reference cell (15) is a replica of a basic reference cell used in a further circuit.

8 Claims, 4 Drawing Sheets

(51) Int. Cl.
  *G05F 3/24* (2006.01)
  *H03K 3/03* (2006.01)

(56) References Cited

U.S. PATENT DOCUMENTS

| | | | |
|---|---|---|---|
| 5,373,226 | A | 12/1994 | Kimura |
| 5,745,002 | A | 4/1998 | Baschirotto et al. |
| 6,366,167 | B1 | 4/2002 | Stockstad |
| 6,407,623 | B1 | 6/2002 | Bazarjani et al. |
| 9,742,356 | B2 | 8/2017 | Takahashi et al. |
| 10,359,794 | B2* | 7/2019 | Ates ............ H03K 3/0315 |
| 2005/0134364 | A1 | 6/2005 | Bhattacharya et al. |
| 2006/0119422 | A1 | 6/2006 | Sakurai et al. |
| 2011/0227646 | A1 | 9/2011 | Yamamoto et al. |
| 2012/0139617 | A1* | 6/2012 | Gerna ............ H03K 3/012 327/513 |

FOREIGN PATENT DOCUMENTS

| | | |
|---|---|---|
| GB | 2261535 A | 11/1992 |
| WO | 2008033809 A2 | 3/2008 |
| WO | 20120165941 A1 | 12/2012 |

OTHER PUBLICATIONS

Jansen, Richard J. E. et al., "Complementary Constant-gm Biasing of Nauta-Transconductors in Low-Power gm-C Filters to ±2% Accuracy Over Temperature," IEEE Journal of Solid-State Circuits, vol. 48, Issue 7, Jul. 2013, IEEE, pp. 1585-1594.

Krummenacher, Francois et al., "A 4-MHz CMOS Continuous-Time Filter with On-Chip Automatic Tuning," IEEE Journal of Solid-State Circuits, vol. 23, Issue 3, Jun. 1988, IEEE, pp. 750-758.

Invitation to Pay Additional Fees and Partial Search for International Patent Application No. PCT/NL2014/050709, dated Jun. 29, 2015, 5 pages.

International Search Report and Written Opinion for International Patent Application No. PCT/NL2014/050709, dated Oct. 7, 2015, 21 pages.

International Preliminary Report on Patentability for International Patent Application No. PCT/NL2014/050709, dated Apr. 27, 2017, 17 pages.

Non-Final Office Action for U.S. Appl. No. 15/518,071, dated Nov. 16, 2018, 5 pages.

Notice of Allowance and Examiner-Initiated Interview Summary for U.S. Appl. No. 15/518,071, dated Mar. 13, 2019, 9 pages.

* cited by examiner

SWITCHED CAPACITOR BIASING CIRCUIT

This application is a divisional of U.S. patent application Ser. No. 15/518,071, filed Apr. 10, 2017, now U.S. Pat. No. 10,359,794, which is a 35 USC 371 national phase filing of International Application PCT/NL2014/050709, filed Oct. 13, 2014, the disclosures of which are incorporated herein by reference in their entireties.

FIELD OF THE INVENTION

The present invention relates to a bias circuit comprising a switched capacitor resistor circuitry, and an operational amplifier. In a further aspect, the present invention relates to a biasing generator circuit.

PRIOR ART

American patent publication U.S. Pat. No. 6,407,623 discloses a bias circuit for maintaining a constant value of a ratio of transconductance divided by load capacitance. A switched-capacitor biasing circuit is used to bias an operational transconductance amplifier to maintain a constant gm/C ratio over process and temperature variations. A fixed bandwidth is thereby obtained for the operational transconductance amplifier.

In European patent publication EP-A-0 766 385 a sampled data-biasing of continuous time integrated circuit scheme is disclosed. The gm/C ratio is made constant through replacing an external accurate resistor by a switched-capacitor circuit to compensate for process and temperature variations of an on-chip filter circuit.

SUMMARY OF THE INVENTION

The present invention seeks to provide an improved biasing circuit, specifically suitable for process and temperature stabilization of integrated circuits.

According to a first aspect of the present invention, a bias circuit is provided comprising a switched capacitor resistor circuitry, an operational amplifier with an input differential transistor pair, and an integrating capacitor connected between an output and an input of the operational amplifier, wherein an output of the switched capacitor resistor circuitry is connected to an input of the operational amplifier, a first input differential transistor being N times larger than a second input differential transistor, and the bias circuit further comprising additional source follower transistors associated with the first and second input differential transistors. The additional source follower transistors improve the compensation behavior of the bias circuit.

In a further aspect of the present invention, a biasing generator circuit is provided, comprising a PMOS switched capacitor reference circuit and a NMOS switched capacitor reference circuit, of which respective outputs are connected to a combiner element, and a transconductor reference cell receiving an output of the combiner element, wherein the transconductor reference cell is a replica of a basic reference cell used in a further circuit, and the biasing generator circuit is arranged to provide a bias output to the further circuit. As a result, the characteristics of the biasing generator circuit used to provide a constant transconductance to load capacitance ratio are improved.

SHORT DESCRIPTION OF DRAWINGS

The present invention will be discussed in more detail below, using a number of exemplary embodiments, with reference to the attached drawings, in which FIG. 1 shows a schematic diagram of an embodiment of the present invention using generic blocks;

DETAILED DESCRIPTION OF EXEMPLARY EMBODIMENTS

The design and fabrication of signal processing integrated circuits is limited by device characteristics which cannot be precisely controlled and have chip to chip and wafer to wafer variations. Integrated circuit designers can take the advantage of matching multiple-like devices, then the circuits become independent of the absolute device characteristics.

Usually on-chip filters require a self-tuning or automatic-tuning circuitry. E.g. the bandwidth and corner frequency of on-chip gm-C filters are dependent on their devices gm/C ratio. Transconductance and capacitor values change ±20% over process and temperature extremes. Therefore on-chip compensation of filters is necessary. This necessitates additional tuning hardware to be implemented on the chip. An oscillator circuit is built with the filter transconductance components and the output frequency of the oscillator is compared with the stable crystal oscillator frequency and necessary calibrations are done with the results of this comparison.

Prior art solutions often require additional silicon area cost and circuit complexity penalty. E.g. in international patent publication WO2012/165941 a complementary constant-gm biasing circuitry is used to compensate the temperature variations within the chip. This approach still needs master-slave tuning with a reference oscillator to correct the center frequency of the filter over process variations.

In European patent publication EP-A-0 766 385 a sampled data-biasing of continuous time integrated circuit scheme is disclosed. The gm/C ratio is made constant through replacing an external accurate resistor by a switched-capacitor circuit to compensate for process and temperature variations of an on-chip filter circuit.

In a first aspect, the present invention aims to improve the characteristics of a biasing generator circuit used to provide a constant transconductance to load capacitance ratio. To that effect a biasing generator circuit is provided comprising a PMOS switched capacitor reference circuit 11 and a NMOS switched capacitor reference circuit 10, of which respective outputs are connected to a combiner element 12, and a transconductor reference cell 15 receiving an output of the combiner element 12. The transconductor reference cell 15 is a replica of a basic reference cell used in a further circuit, and the biasing generator circuit is arranged to provide a bias output to the further circuit.

Figure 1:
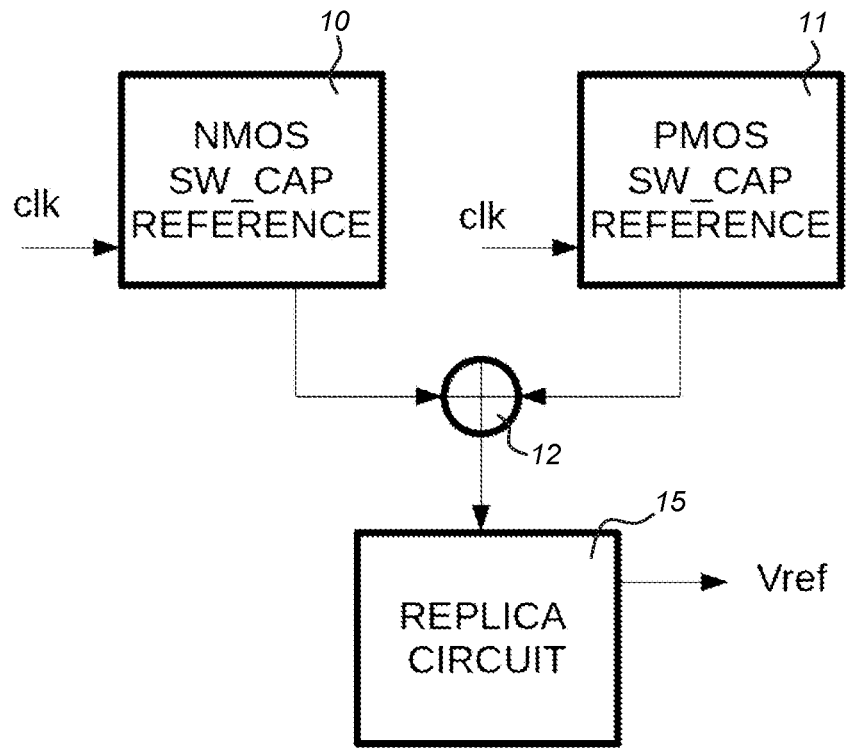

FIG. 1 shows a schematic diagram of an embodiment of the present invention using generic blocks. NMOS and PMOS switched capacitor reference circuits 10, 11 generate proper biasing for the transconductance reference cell (or replica circuit) 15, using a combiner element 12. In this diagram, the output of the biasing generator circuit is the output Vref of the transconductance reference cell 15 (labelled replica circuit in FIG. 1). A clock signal clk is used to drive the switched capacitor circuitry.

Figure 2:
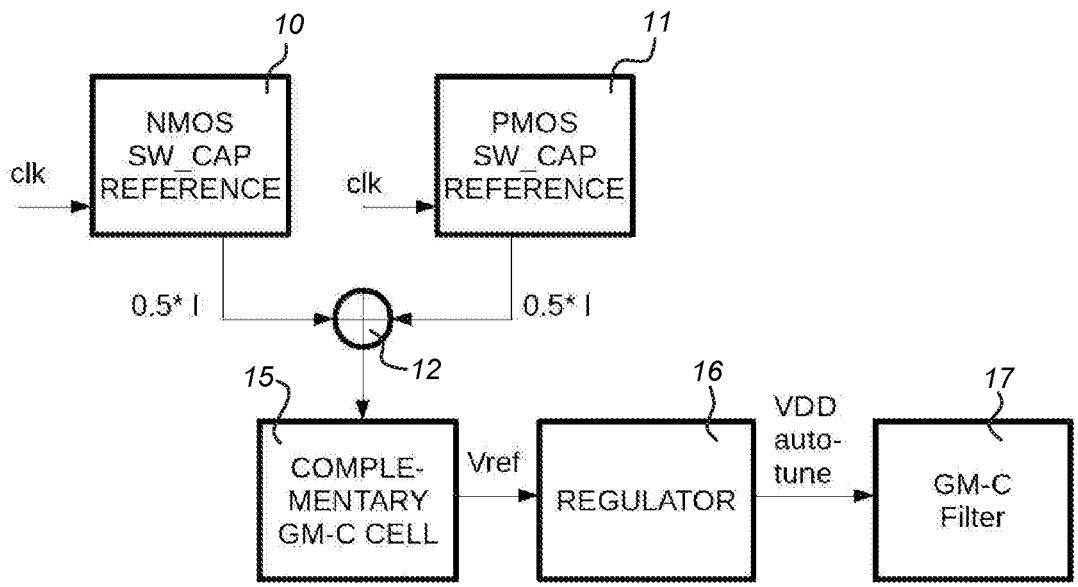
FIG. 2 shows a schematic diagram of a further embodiment of the present invention.

FIG. 2 illustrates how the disclosed invention can be used to properly bias a gm-C filter 17 to create an automatically tuned filter with low area and current consumption cost. The output Vref of the transconductance reference cell 15 (labelled Complementary gm-C cell in FIG. 2) is input to a regulator 16, the output of which is used to provide the bias for a gm-C filter 17 (using the Vdd auto-tune voltage). Thus, in an embodiment of the present invention, the further circuit is a continuous time gm-C filter circuit 17 (in combination with the regulator 16). As an alternative embodiment, the further circuit is a ring oscillator circuit, wherein the transconductance reference cell 15 is properly embodied to reflect the basic reference cell used in the ring oscillator.

With the present invention embodiments, no additional hardware is required such as a replica oscillator circuit, nor the production calibration. A further circuit 17 such as a filter is calibrated real-time with switched-capacitor biasing circuitry comprising NMOS switched capacitor reference circuit 10, PMOS switched capacitor reference circuit 11, combiner element 12, and transconductor reference cell 15 that uses the same capacitor type used inside the gm-C filter and a stable crystal oscillator clock input (clk). Transconductances inside the filter 17 are real time tuned to have a constant gm/C ratio over process and temperature changes. The switched-capacitor biasing circuitry comprising NMOS switched capacitor reference circuit 10, PMOS switched capacitor reference circuit 11, combiner element 12, and transconductor reference cell 15 can be used with NMOS only, PMOS only or complementary MOS based further circuits, such as gm-C filter circuits.

Figure 3:
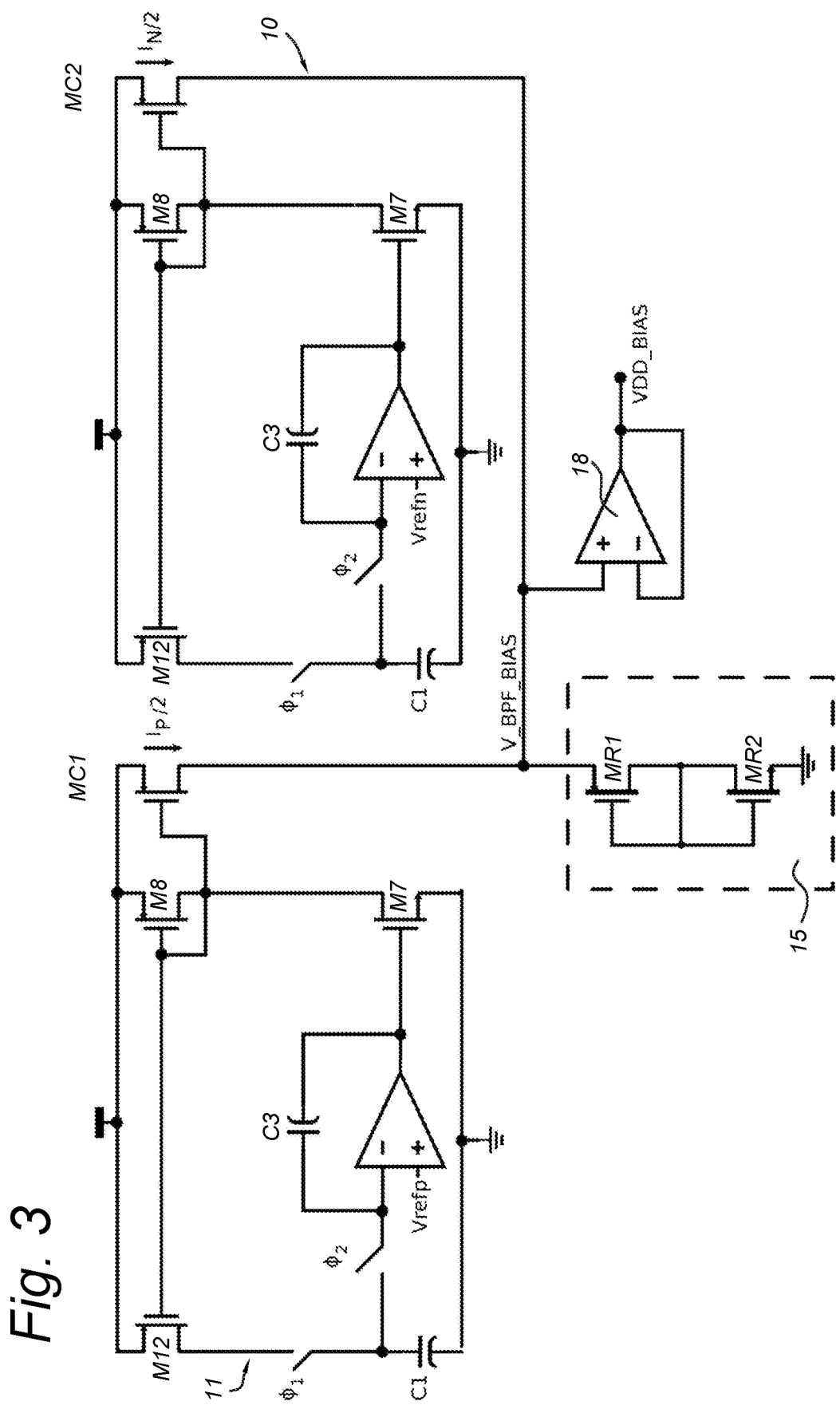
FIG. 3 shows a schematic diagram of a biasing generator circuit according to a further aspect of the present invention.

A detailed implementation of an embodiment of the present invention is illustrated in FIG. 3 as a switched capacitor based biasing generator circuit. The biasing generator circuit comprises a PMOS switched capacitor reference circuit 11 and a NMOS switched capacitor reference circuit 10, which are described in more detail below with reference to FIG. 4 and FIG. 5, respectively. The biasing generator circuit is designed to stabilize the center frequency and bandwidth of an integrated gm-C bandpass filter which can be supplied by the biasing generator circuit of FIG. 3.

The biasing generator circuit uses the same capacitances C1 that is used in the further circuit connectable to the biasing generator circuit (in each of the NMOS switched capacitor reference circuit 10 and PMOS switched capacitor reference circuit 11). It also uses a transconductor reference cell 15 as a bias voltage reference, which transconductor reference cell 15 is based on the same technology as that used in the further circuit (i.e. a replica circuit). A crystal oscillator clock (not shown) is used to drive the switches with generated non-overlapping clocks $\Phi_1$ and $\Phi_2$. A generated reference voltage (V_BPF_BIAS) is applied to the further circuit through a low drop out (LDO) regulator circuit 18. In other words, the biasing generator circuit further comprises a low-drop out (LDO) regulator circuit 18 connected to an output of the transconductor reference cell 15 in a further embodiment. This allows a lower minimum operating voltage, higher efficiency operation and lower heat dissipation.

Both stabilizing currents $I_p/2$ and $I_n/2$ generated in the output transistors MC1 and MC2 (as shown in FIG. 3) are applied to the transconductor reference cell 15 comprising reference cell transistors MR1, MR2) to compensate the transconductance (gm) and threshold (Vth) values over process and temperature.

In summary, the present invention embodiments provide for a switched capacitor reference circuit, which comprises of a NMOS switched capacitor reference circuit 10 and a PMOS switched capacitor reference circuit 11 providing current to a replica circuit 15 that needs to be stabilized over corners. By using NMOS and PMOS switched capacitor reference circuits 10, 11 with optimum ratio of output currents $I_p/2$ and $I_n/2$, a suitable reference bias is generated to compensate for process and temperature variations of the replica circuit 15. Using this generated replica circuit bias to supply a further circuit 17, e.g. a continuous-time filter (BPF) circuit, characteristics such as center frequency and bandwidth can be stabilized over process and temperature. This eliminates the area associated with additional hardware as needed in prior art solutions to stabilise the filter characteristics.

In this disclosure, the switched-capacitor based biasing circuitry includes NMOS and PMOS switched capacitor reference circuits 10, 11, non-overlapping clock generator to drive the NMOS and PMOS switched capacitor reference circuits 10, 11 using a clock signal clk, and an LDO (low-dropout regulator) circuit 18. It also uses a crystal oscillator as a stable clock reference input and generates a voltage biasing output Vref to the further circuit 17 to be stabilized such as a gm-C based bandpass filter circuit. Transconductances in the further circuit 17 are tuned so that the gm/C ratio is constant, which provides reproducible filter characteristics. The advantages of the present invention embodiments are that a simple and cost-effective solution is given, using two switched capacitor reference circuits 11, 10 based on PMOS and NMOS, respectively, of which both currents $I_p/2$ and $I_n/2$ with an optimum ratio are fed into a replica circuit 15 of a further circuit 17 that needs to be stabilized over corners, in order to generate a suitable reference. No additional hardware required such as a replica oscillator circuit, and no production calibration is needed. The present invention embodiments require only limited additional chip area and power consumption.

A further aspect of the present invention relates to improvements in bias circuits which can be used as the PMOS and NMOS switched capacitor reference circuits 11, 10 of the biasing generator circuit described above. Implementations of the PMOS and NMOS switched capacitor reference circuits 11, 10 are shown in the circuit diagrams of FIGS. 4 and 5, respectively.

Figure 4:
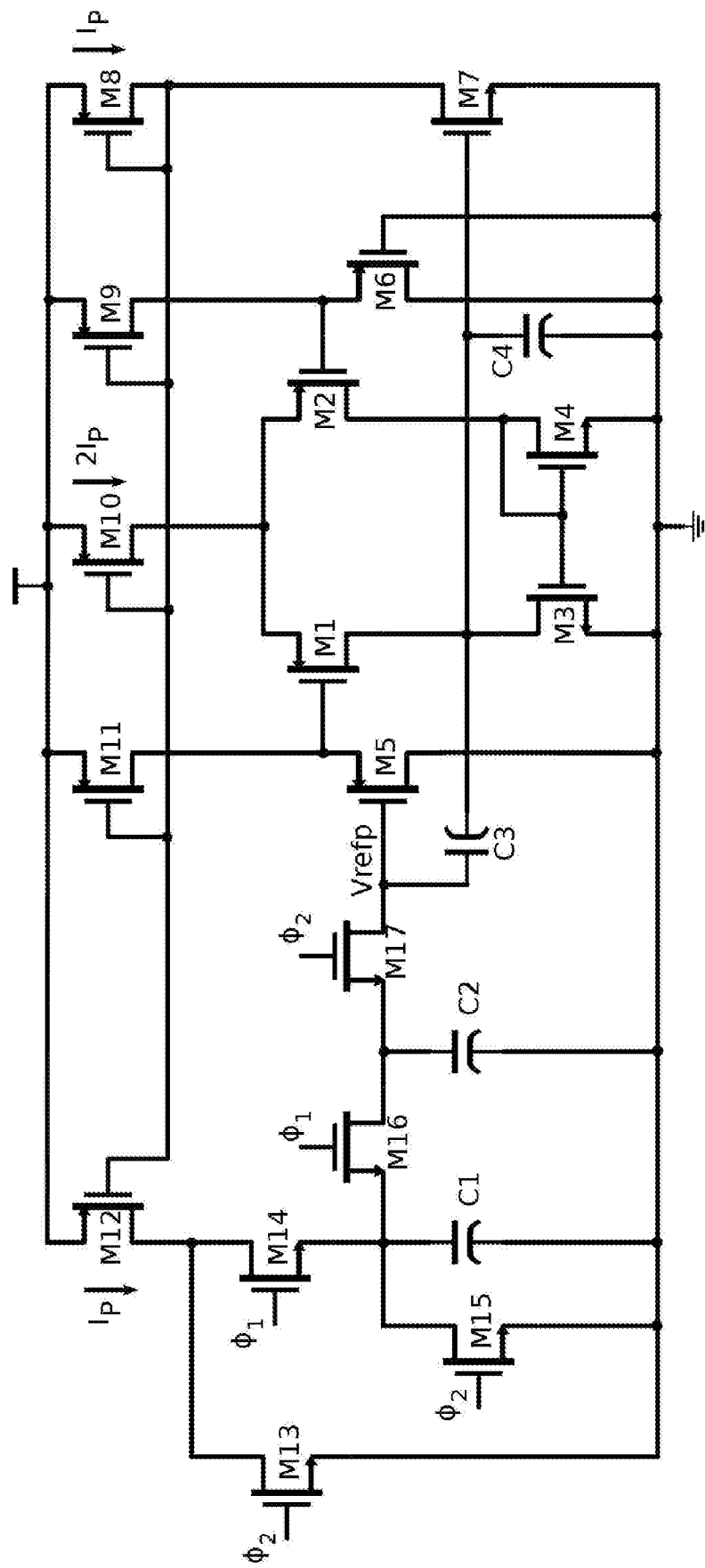
FIG. 4 shows a circuit diagram of a PMOS based bias generator.
Figure 5:
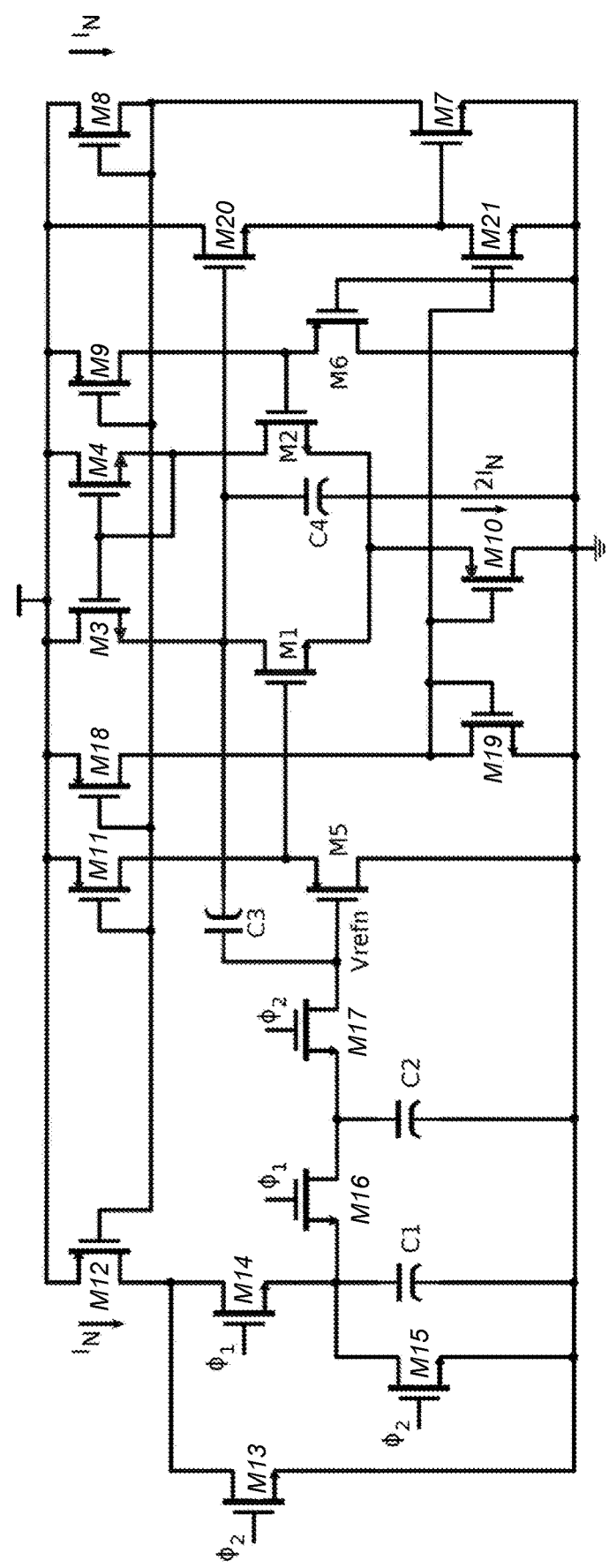
FIG. 5 shows a circuit diagram of a NMOS based bias generator.

In general terms, a bias circuit is provided comprising a switched capacitor resistor circuitry (capacitors C1, C2, and transistors/switches M12-M17), an operational amplifier (transistors M1-M4, M10) with an input differential transistor pair M1, M2, and an integrating capacitor C3 connected between an output and an input of the operational amplifier M1-M4, M10, wherein an output of the switched capacitor resistor circuitry C1, C2, M12-M17 is connected to an input of the operational amplifier M1-M4, M10 (indicated as $Vref_p$ and $Vref_n$). A first input differential transistor M1 is N times larger than a second input differential transistor M2, to ensure an offset voltage is generated at the input of the operational amplifier, while the currents are equal. The bias circuit further comprises additional source follower transistors M5, M6 associated with input differential transistors M1, M2 of the operational amplifier M1-M4, M10. Further additional transistors may be provided as shown in the embodiments of FIGS. 4 and 5 (transistor M11 in series connection with a first additional source follower transistor M5, and transistor M9 in series connection with a second additional source follower transistor M6). Compensation behavior of the bias circuit is improved as a result, as will be demonstrated below.

The circuit shown in FIG. 4 is a practical way to generate a current equivalent to that produced with a switched-capacitor resistor circuitry. The operation is as follows. There are two non-overlapping phases $\Phi_1$ and $\Phi_2$. During $\Phi_2$, the capacitor $C_1$ is discharged completely. At the same time, $C_2$'s voltage is forced to $V_{REF}$ by the virtual ground of the operational amplifier M1-M4, M10. During $\Phi_1$, the output of the operational amplifier provides a constant voltage to the gate of transistor M7, which, in turn, provides a constant current to $C_1$ and $C_2$ via the mirror transistors M12 and M8. Accordingly, the voltage across and ramps linearly, and at the end of $\Phi_1$, its value is $$V(C_2) = \frac{C_2 V_{REF} + I \cdot \Delta T_1}{C_1 + C_2}$$

where $\Delta T_1$ is the duration of $\Phi_1$, $C_2$ is then discharged into the integrating capacitor $C_3$ during $\Phi_2$ at the same time $C_1$ is discharged to ground. If the voltage across $C_2$ ($V(C_2)$) is larger than $V_{REF}$, the output of the operational amplifier (drain of transistor M1) will decrease when $C_2$ is discharged into the virtual ground. This will cause a decrease in current for the next cycle. Similarly, if $V(C_2)$ is less than $V_{REF}$, the current will be increased for the next cycle.

Thus, if the loop is stable, the steady-state value of $V(C_2)$ is equal to $V_{REF}$, and the steady-state current will be $$I = \frac{V_{REF} C_1}{\Delta T_1} = 2 V_{REF} C_1 F_{CLK}$$

where a 50% duty cycle is assumed for simplicity (i.e., 2 $\Delta T_1 = 1/F_{CLK}$).

Transistors M10 and M1-M4 thus act as an integrating operational amplifier that drives the gate of M7. The circuit generates its own reference because M1 and M2 are biased so that they will have the same current, but is M1 is N times as wide as M2. Therefore, the voltage difference across their gates will be (assuming strong inversion operation)

$$V_{REF} = V_{GS1} - V_{GS2} = \sqrt{\frac{2IL}{\mu C_{ox} W}} \left(1 - \frac{1}{\sqrt{N}}\right)$$

A MOS differential pair transistor of dimensions $W_{diff}/L_{diff}$ biased with a current equal to the current in M2 will have a transconductance $$g_m = 4 F_{CLK} C_1 \sqrt{\frac{L}{W} \frac{W_{diff}}{L_{diff}}} \left(1 - \frac{1}{\sqrt{N}}\right)$$

where W and L are the dimensions of M2.

Finally, the bandwidth of an amplifier built with this differential pair and compensated with a capacitance C4 will be $$\frac{g_m}{C_4} = 4 F_{CLK} \frac{C_1}{C_4} \sqrt{\frac{L}{W} \frac{W_{diff}}{L_{diff}}} \left(1 - \frac{1}{\sqrt{N}}\right)$$

which is independent of process and temperature.

It is noted that in an embodiment the bias circuit may comprise a stabilizing capacitor C4 connected between a drain of a first input differential transistor (M1) of the operational amplifier (M1-M4, M10) and a ground. Alternatively, a gate-source capacitance of the output transistor M7 may be used for this purpose.

A similar derivation assuming weak inversion for M1 and M2 as well as the operational amplifier differential pair M3, M4 results in $$\frac{g_m}{C_4} = 2 F_{CLK} \frac{C_1}{C_4} \ln(N)$$

which is also independent of process and temperature.

For best performance, the input differential pair of the further circuit 17 should not only be the same type as M1 and M2, but it should operate at a current density equal to the geometric mean of the current densities of M1 and M2. If this is done, then a constant—characteristic will occur regardless of the bias region (sub-threshold, strong inversion, etc) of the differential pair. As a practical matter, good results are obtained even if the bias points are not identical.

Of course there are countless ways of using feedback and transistors biased at different current densities to produce this same type of result. One advantage of the topology in FIG. 4 is that the differential pair can be biased to mimic the differential pair of the operational amplifier which it is to bias. In addition, small switches M13-M17 can be used in the switched capacitor resistor circuitry because most of the supply voltage can be used to drive them since one side of the switch is always at (or close to) the negative supply rail.

The circuitry as shown with reference to FIG. 4 can be used as a PMOS bias generator. The circuitry as shown with reference to FIG. 5 can be used as a NMOS bias generator, and further comprises additional NMOS compensating circuitry (M18-M21) associated with the additional source follower transistors (M5, M6).

As already mentioned above, an input differential pair of transistors of an integrator (C3, M1-M4) is dimensioned with a first input transistor M1 being N times larger than a second input transistor M2, so that there will be an offset voltage generated at the input of the operational amplifier M1-M4 which is related to $V_{ref} = V_{GS1} - V_{GS2}$ while their currents are equal to each other. M1 and M2 input differential transistors current densities are made equal to the reference transconductor cell's transistors MR1, MR2 (see FIG. 3 and description above). For the PMOS switched capacitor reference circuit 11, output current can be defined as:

$$I_p = 2 V ref_p C_1 F_{CLK}$$

$$V ref_p = \sqrt{\frac{2 I_p}{K_p}} \left(1 - \frac{1}{\sqrt{N}}\right)$$

$$\sqrt{I_p} = 2 \sqrt{\frac{2}{K_p}} \left(1 - \frac{1}{\sqrt{N}}\right) C_1 F_{CLK}$$

Similarly, for the NMOS switched capacitor reference circuit 10, the current is:

$$\sqrt{I_n} = 2 \sqrt{\frac{2}{K_n}} \left(1 - \frac{1}{\sqrt{N}}\right) C_1 F_{CLK}$$

where $K_p$ and $K_n$ are defined as below:

$$K_p = \mu_p C_{ox} \frac{W_p}{L_p}$$

$$K_n = \mu_n C_{ox} \frac{W_n}{L_n}$$

So the total effective gm of the reference transconductor cell 15 (and thus of the further circuit 17) can be derived as below:

$$g_m = \sqrt{2K_p \frac{I_p + I_n}{2}} + \sqrt{2K_n \frac{I_p + I_n}{2}} =$$

$$\sqrt{K_p(I_p + I_n)} + \sqrt{K_n(I_p + I_n)} = \sqrt{K_p + K_n}\sqrt{I_p + I_n}$$

If the $I_p$ and $I_n$ equations are entered into the above gm equation the following equation results:

$$g_m = \frac{K_p + K_n}{\sqrt{K_p K_n}} 2\sqrt{2}\left(1 - \frac{1}{\sqrt{N}}\right) C_1 F_{CLK}$$

And hence the gm/C ratio will become:

$$\frac{g_m}{C_1} = \frac{K_p + K_n}{\sqrt{K_p K_n}} 2\sqrt{2}\left(1 - \frac{1}{\sqrt{N}}\right) F_{CLK}$$

As can be seen from the above equation the filter center frequency and the bandwidth characteristics will become independent of the capacitor absolute value and its process change. When we make $K_p=K_n$ through dimensioning the PMOS transistor width 2.5 times larger than the NMOS transistor, their mobilities ($\mu_n$ and $\mu_p$) and their temperature dependency will also be cancelled first orderly. In other words, the PMOS transistor MR1 has a gain factor $K_p$ and the NMOS transistor MR2 has a gain factor $K_n$, wherein $K_p=K_n$. Transistor threshold voltage ($V_{th}$) changes over process and its temperature dependency is already fully compensated automatically. Remaining not-cancelled parts are second order mobility variations and transistor $W_p$, $L_p$, $W_n$, and $L_n$, mismatches, which are relatively small effects. It is noted that in the prior art disclosure of U.S. Pat. No. 6,407,623 only PMOS transistor characteristics are compensated over process and temperature. If this bias is used for an inverter like transconductor circuit, then all NMOS $K_n$ and $V_{th}$ parameters will appear at the $g_m/C$ ratio, so the ratio will become process and temperature dependent.

The present invention embodiments have been described above with reference to a number of exemplary embodiments as shown in the drawings. Modifications and alternative implementations of some parts or elements are possible, and are included in the scope of protection as defined in the appended claims.

The invention claimed is:

1. Biasing generator circuit comprising:
   a PMOS switched capacitor reference circuit configured to generate a first reference signal;
   an NMOS switched capacitor reference circuit configured to generate a second reference signal;
   a combiner element configured to receive and generate a third reference signal that is a combination of the first reference signal and the second reference signal; and
   a transconductor reference cell configured to receive the third reference signal and generate a bias signal from the third reference signal.

2. Biasing generator circuit according to claim 1, wherein the transconductor reference cell comprises a PMOS transistor and an NMOS transistor, wherein the PMOS transistor has a gain factor $K_p$ and the NMOS transistor has a gain factor $K_n$, wherein $K_p=K_n$.

3. Biasing generator circuit according to claim 1, further comprising a low-drop out (LDO) regulator circuit connected to an output of the transconductor reference cell.

4. Biasing generator circuit according to claim 1, wherein the transconductor reference cell is further configured to provide the bias signal to a continuous time gm-C filter circuit.

5. Biasing generator circuit according to claim 1, wherein the transconductor reference cell is further configured to provide the bias signal to a ring oscillator circuit.

6. Biasing generator circuit according to claim 2, further comprising a low-drop out (LDO) regulator circuit connected to an output of the transconductor reference cell.

7. Biasing generator circuit according to claim 6, wherein the transconductor reference cell is further configured to provide the bias signal to a continuous time gm-C filter circuit.

8. Biasing generator circuit according to claim 6, wherein the transconductor reference cell is further configured to provide the bias signal to a ring oscillator circuit.

* * * * *